United States Patent
Moriyama et al.

(12)
(10) Patent No.: US 6,447,612 B1
(45) Date of Patent: Sep. 10, 2002

(54) FILM-FORMING APPARATUS FOR FORMING A DEPOSITED FILM ON A SUBSTRATE, AND VACUUM-PROCESSING APPARATUS AND METHOD FOR VACUUM-PROCESSING AN OBJECT

(75) Inventors: Koichiro Moriyama, Kyotanabe; Masahiro Kanai, Tokyo; Yuzo Koda, Kyotanabe; Tadashi Hori, Nara, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 175 days.

(21) Appl. No.: 09/625,840

(22) Filed: Jul. 26, 2000

(30) Foreign Application Priority Data

Jul. 26, 1999 (JP) .............................. 11-210544
Jul. 19, 2000 (JP) ......................... 2000-218395

(51) Int. Cl.[7] .............................................. C23C 16/00
(52) U.S. Cl. ..................... 118/718; 118/723 E; 427/569
(58) Field of Search .................. 118/718, 719, 118/723 E; 427/255.5, 569

(56) References Cited

U.S. PATENT DOCUMENTS 4,400,409 A    8/1983  Izu et al. ..................... 427/39
5,510,151 A    4/1996  Matsuyama et al. ......... 427/509

FOREIGN PATENT DOCUMENTS

EP    0782176 A2    7/1997
JP    9-181005      7/1997

*Primary Examiner*—Thi Dang
(74) *Attorney, Agent, or Firm*—Fitzpatrick, Cella, Harper & Scinto

(57) ABSTRACT

A film-forming apparatus which has at least a vacuum vessel whose inside is capable of being vacuumed and a film-forming chamber having a discharge region provided in said vacuum vessel and in which a substrate web having a desired width and a desired length is arranged so as to constitute a part of said film-forming chamber, wherein said substrate web is continuously moved to pass through said discharge region of said film-forming chamber to continuously form a deposited film on said substrate web, characterized in that said film-forming chamber is provided with an opening-adjusting member such that said opening-adjusting member constitutes an entrance or/and an exit of said film-forming chamber, and a face of said opening-adjusting member which is opposed to said substrate web has one or more grooves formed substantially in parallel to a direction for said substrate web to be transported.

27 Claims, 10 Drawing Sheets

FILM-FORMING APPARATUS FOR FORMING A DEPOSITED FILM ON A SUBSTRATE, AND VACUUM-PROCESSING APPARATUS AND METHOD FOR VACUUM-PROCESSING AN OBJECT

BACKGROUND OF THE INVENTION

1. Field of the Invention

The present invention relates to a film-forming apparatus for forming a functional deposited film on a substrate. The present invention also relates to a vacuum processing apparatus and a vacuum processing method for vacuum-processing an object. Still more particularly, the present invention relates to a roll-to-roll type continuous film-forming apparatus having a plurality of vacuum chambers communicated with each other, which enables one to continuously form a functional deposited film on an elongated substrate such as a substrate web by continuously transporting the substrate in the longitudinal direction to sequentially pass through said plurality of vacuum chambers while forming a desired functional deposited film in each vacuum chamber. The film-forming apparatus is suitable particularly for continuously forming a semiconductor element such as a photovoltaic element including a solar cell.

2. Related Background Art

For the continuous formation of a functional deposited film on a substrate which is suitable for use in the production of a photovoltaic element including a solar cell, there are a number of proposals in which a plurality of deposition chambers are provided such that they are communicated with each other, and an elongated substrate (a substrate web) is continuously moved to sequentially pass through said plurality of deposition chambers while forming a desired functional deposited film on the substrate by each deposition chamber. For instance, U.S. Pat. No. 4,400,409 (hereinafter referred to document 1) and U.S. Pat. No. 5,510,151 (hereinafter referred to as document 2) disclose a method and an apparatus for continuously forming a photovoltaic element on an elongated substrate, i.e., a substrate web by way of a roll-to-roll film-forming process. Particularly, these documents 1 and 2 describe that using a film-forming apparatus comprising a plurality of vacuum vessels capable of being vacuumed and a plurality of film-forming chambers having a discharge region each provided in one of said plurality of vacuum vessels wherein said plurality of vacuum vessels are communicated with each other, a substrate web having a desired width is transported in the longitudinal direction and along a prescribed pathway for the substrate web to be moved to sequentially pass through the film-forming chambers each provided in the vacuum vessel while forming a desired deposited film on the substrate web by each film-forming chamber, whereby an element having a semiconductor junction can be continuously formed on the substrate web. Specifically, the film-forming apparatus described in documents 1 and 2 is structured such that the vacuum vessels each having the film-forming chamber provided therein can be evacuated to maintain their inside at a reduced pressure and the substrate web can be transported while being held so as to serve as an upper wall of each film-forming chamber. In each of the film-forming chambers each provided in one of the vacuum vessels, a raw material gas and an electric power(such as a high frequency power) for exciting or decomposing said raw material gas are introduced therein to form a desired deposited film on the substrate web by way of plasma CVD, sputtering or the like.

Incidentally, in the film-forming apparatus comprising a plurality of vacuum vessels capable of being vacuumed and a plurality of film-forming chambers having a discharge region each provided in one of said plurality of vacuum vessels wherein said plurality of vacuum vessels are communicated with each other, a substrate web having a desired width is transported in the longitudinal direction and along a prescribed pathway for the substrate web to be moved to sequentially pass through the film-forming chambers each provided in the vacuum vessel while forming a desired deposited film on the substrate web by each film-forming chamber, it is known, as disclosed, for instance, in Japanese Unexamined Patent Publication No. 181005/1977, that each film-forming chamber is provided with a slit-like opening at each of its opposite sides through which the substrate web is moved, and an opening-adjusting member having a slit which allows the substrate web to pass through is provided at the slit-like opening for determining the width of the slit-like opening, wherein the slit-like opening provided at one film-forming chamber is communicated with a passage way for the substrate web which is communicated with another slit-like opening provided at the other film-forming chamber which is situated adjacent to said film-forming chamber. The opening-adjusting member also serves to restrict the extent of a region for the substrate web to be exposed to a plasma or the like in the film-forming chamber, namely, the area of a film-forming region in the film-forming chamber in order to control the thickness or property of a film deposited on the substrate web in the film-forming chamber.

The opening-adjusting member further serves to prevent a raw material gas and excited species thereof and a high frequency power for exciting said raw material gas in the film-forming chamber from being leaked outside the film-forming chamber.

In the present invention, attention is focused on the functions of the opening-adjusting member to allow the substrate web to pass therethrough into the film-forming chamber while preventing the raw material gas, the excited species thereof, and the high frequency power in the film-forming chamber from being leaked outside the film-forming chamber.

By the way, the height of the slit of the opening-adjusting member, that is, the clearance of the opening-adjusting member is usually extremely narrowed to an extent of several millimeters. In order to improve the characteristics of an element to be formed on the substrate web, it is necessary to adequately change particularly the inner pressure in each film-forming chamber upon film formation, and in the case where the electric power introduced into a given film-forming chamber is increased, it is necessary to have a due care so that the plasma is confined within the film-forming chamber. In this connection, it is desired that the slit-like opening is made have a cross section which is as smaller as possible and its length in the transportation direction of the substrate web is prolonged.

As the substrate web, it is usually use a substrate web which has a thickness which is sufficiently thin with respect to the width and a sufficiently long length and which has a substantially flat surface at room temperature where no external pressure is applied thereon. In the case where the film-forming chamber is shaped in a rectangular form whose upper side is open while maintaining the substrate web in a plane state by applying a prescribed tensile force thereto in the longitudinal direction, the substrate web is transported such that it serves to establish a upper wall for the film-forming chamber.

Incidentally, the above described film-forming technique have such disadvantages as will be described below.

That is, a prescribed heater is provided in each film-forming chamber in order to heat the substrate web to a desired temperature. Because of this, there is an occasion in that the substrate web heated by the heater is spontaneously deformed in a bow or wave form to have a flexture.

As one of the causes of occurring such flexture for the substrate web, there is known a situation such that in the case where the substrate web which is transported in the longitudinal direction of the film-forming apparatus is heated in the film-forming chamber, the substrate web is sometimes partially thermally expanded in its width direction, and other portion of the substrate web is shrunk by being cooled, where displacement is occurred at the substrate web in a direction perpendicular to the surface of the substrate web, whereby a portion of the substrate web which corresponds the thermally expanded portion in the width direction is relaxed and as a result, the substrate web is deformed as above described. As another cause, there is an occasion in that a stress is occurred between a film deposited on the surface of the substrate web by heating the substrate web and the substrate web itself, whereby the substrate web is deformed as above described.

When the substrate web is deformed as above described and it is contacted with the opening-adjusting member, a cut defect is liable to occur at the substrate web which is transported. Particularly, when the deposited film-bearing face of the substrate web is contacted with the opening-adjusting member, there will be an occasion for the deposited film to be damaged. In the case where a photovoltaic element is prepared using the deposited film having such damage, the photovoltaic element is liable to have a defect such that a short-circuited defect will occur at the damaged portion of the deposited film constituting the photovoltaic element. Separately, when the face with no film of the substrate web is contacted with the opening-adjusting member, there is an occasion in that the substrate web or/and the opening-adjusting member are partially cut to cause a powdery material, which will be a cause of generating dust in the film-forming chamber.

In order to deal with such problems, Japanese Unexamined Patent Publication No. 181005/1997 (hereinafter referred to document 3) discloses a means of forcibly remedying the configuration of the substrate web to a desired curved form, where certain expected effects are obtained. Particularly, document 3 discloses a method in that a substrate web having magnetism is transported while being supported using a magnet roller which is shaped not in a cylindrical form but in a form having a continuously varied diameter, wherein the traverse form of the substrate web is forcibly made into a curved form along the external shape of the magnet roller and the opening of the film-forming chamber is shaped to follow said curved form, whereby the substrate web is prevented from being spontaneously deformed by virtue of heat and a prescribed clearance is established between the substrate web and the opening-adjusting member to prevent the substrate web from being damaged by the opening-adjusting member. The opening-adjusting member in this case is configured such that its face which is opposed to the substrate web is entirely curved.

Even for the technique disclosed in document 3, there are still some subjects which are necessary to be solved. That is, in the case where the extent for the substrate web to be spontaneously deformed or the magnet roller is relatively weak in terms of the magnetic force, there is an occasion in that the substrate web is difficult to be completely remedied into a desired form, where it is difficult to sufficiently prevent occurrence of a flaw at the substrate web. Besides, in the case where especially the inner pressure of the film-forming chamber is changed or the electric power introduced into the film-forming chamber for decomposing the raw material gas therein is increased in order to improve the characteristics of, for instance, a photovoltaic element to be obtained, when the raw material gas or excited species are leaked outside the film-forming chamber or the electromagnetic wave is leaked outside the film-forming chamber, there is an occasion in that a film is deposited on an unnecessary portion of the vacuum vessel which encloses the film-forming chamber or the electric power cannot be introduced into the film-forming chamber as desired.

In order to prevent such leakage, it is necessary to improve the effect of the opening-adjusting member to confine the raw material gas including excited species and the electric power within the film-forming chamber. In order to achieve this purpose, it is desired to adopt measures such that the area of the substantial opening through which the substrate web passes, specifically, the cross section of the opening-adjusting member is diminished as smaller as possible and the length of the opening-adjusting member in the transportation direction of the substrate web is prolonged, whereby the conductance of the position where the opening-adjusting member is provided is diminished and the confining effect of the electromagnetic wave is improved. However, when the height of the slit of the opening-adjusting member is diminished in order to diminish the cross section of the opening-adjusting member, a problem is liable to occur such that the probability for the substrate web to be contacted with the opening-adjusting member is increased even in the case where the magnitude for the substrate web to be deformed is small. And, in the case where the length of the opening-adjusting member in the transportation direction of the substrate web is prolonged, a problem is liable to entail such that even when a slight discrepancy is present at the setting position of the opening-adjusting member or at the passage of the substrate web, there is occurred a portion which makes shorten the distance between the opening-adjusting member and the substrate web such that they come to close each other, where the probability for the substrate web to be contacted with the opening-adjusting member is increased.

Incidentally, in the prior art, in order to solve the problems relating to the contact between the substrate web and the opening-adjusting member, there has been adopted a manner in that the height of the slit, that is, the clearance of the opening-adjusting member is made to be sufficiently large. In this connection, there has been a problem in that the raw material gas in the film-forming chamber is leaked outside the film-forming chamber in the vacuum vessel which encloses the film-forming chamber through the opening-adjusting member and the raw material gas thus leaked is followed by flowing into the adjacent vacuum vessel to contaminate into the film-forming chamber provided therein, where the property of a film deposited on the substrate web is deteriorated. In addition, there has been also a problem in that in order to prevent the excited species or the electromagnetic wave in the film-forming chamber from being leaked outside the film-forming chamber in the vacuum vessel which encloses the film-forming chamber, it is required to diminish the electric power introduced into the film-forming chamber for the decomposition of the raw material gas therein to less than certain upper limit, where the latitude of the electric power introduced is narrowed.

SUMMARY OF THE INVENTION

An principal object of the present invention is to solve the foregoing subjects in the prior art and to improve the opening-adjusting member so that an object to be treated is effectively prevented from being contacted with the opening-adjusting member and in addition, processing gas and electromagnetic wave is effectively prevented from being leaked outside the processing chamber.

Another object of the present invention is to provide an improved film-forming apparatus in which a substrate web on which a deposited film is to be formed is effectively prevented from being contacted with the opening-adjusting member upon transporting the substrate web and the effect of the opening-adjusting member to confine raw material gas and electromagnetic wave within the film-forming chamber (the processing chamber) is improved so that the raw material gas and the electromagnetic wave are effectively prevented from being leaked outside the film-forming chamber, and which enables one to continuously form a semiconductor element such as a photovoltaic element including a solar cell having improved characteristics on the substrate web.

A further object of the present invention is to provide a film-forming apparatus which has at least a vacuum vessel whose inside is capable of being vacuumed and a film-forming chamber having a discharge region provided in said vacuum vessel and in which a substrate web is arranged so as to constitute a part of said film-forming chamber, wherein said substrate web is continuously moved to pass through said discharge region of said film-forming chamber to continuously form a deposited film on said substrate web, characterized in that said film-forming chamber is provided with an opening-adjusting member such that said opening-adjusting member constitutes an entrance or/and an exit of said film-forming chamber, and a face of said opening-adjusting member which is opposed to said substrate web has one or more grooves formed substantially in parallel to a direction for said substrate web to be transported.

A further object of the present invention is to provide a vacuum-processing apparatus having a processing chamber whose inside is capable of being vacuumed and in which discharging is capable of being performed, said processing chamber having an opening portion through which an object to be processed being capable of passing between an outside of said processing chamber and said inside of said processing chamber, wherein said opening portion of said processing chamber has an opening-adjusting member for narrowing an opening area of said opening portion, and a face of said opening-adjusting member which is opposed to said object which passes through said opening portion has a recessed portion.

A further object of the present invention is to provide a vacuum-processing method for vacuum-processing an object to be processed in a processing chamber whose inside is capable of being vacuumed and in which discharging is capable of being per formed and which has an opening portion, wherein said method includes a passing step of passing said object between an outside of said processing chamber and an inside of said processing chamber, and in said passing step, said object is passed through an opening-adjusting member whose surface opposed to said object has a recessed portion.

DESCRIPTION OF THE INVENTION AND PREFERRED EMBODIMENTS

Figure 1:
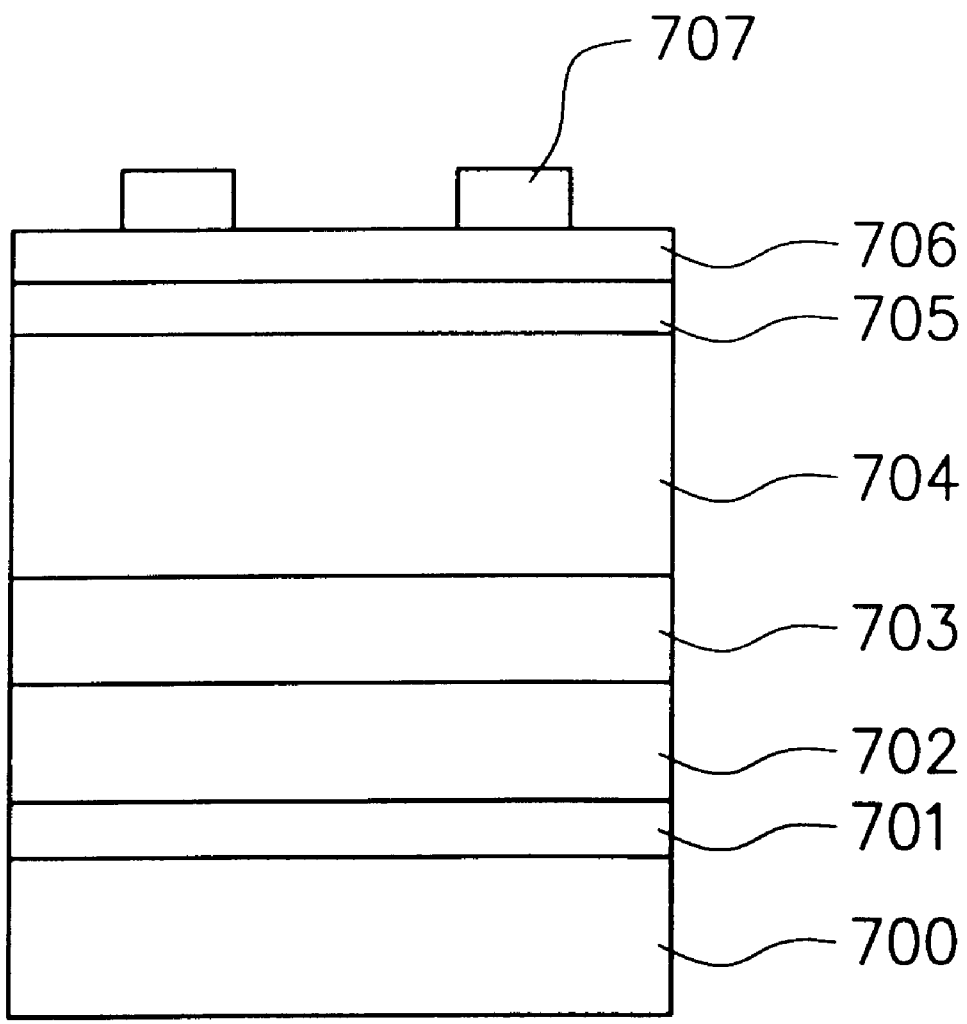
FIG. 1 is a schematic cross-sectional view illustrating the configuration of an example of a photovoltaic element prepared in the present invention.

The present invention solves the foregoing subjects in the prior art and attains the above described objects.

As previously described, a first aspect of the present invention is to provide a film-forming apparatus which has at least a vacuum vessel whose inside is capable of being vacuumed and a film-forming chamber having a discharge region provided in said vacuum vessel and in which a substrate web is arranged so as to constitute a part of said film-forming chamber, wherein said substrate web is continuously moved to pass through said discharge region of said film-forming chamber to continuously form a deposited film on said substrate web, characterized in that said film-forming chamber is provided with an opening-adjusting member such that said opening-adjusting member constitutes an entrance or/and an exit of said film-forming chamber, and a face of said opening-adjusting member which is opposed to said substrate web has one or more grooves formed substantially in parallel to a direction for said substrate web to be transported.

The groove provided at the opening-adjusting member in the film-forming apparatus of the present invention may take any of such configurations as will be described below.

In a first instance, the groove is configured such that the width thereof in a direction of the width of the substrate web is continuously changed in a direction for the substrate web to be transported.

In a second instance, the groove is configured such that the depth thereof is continuously changed in a direction of the width of the substrate web or/and in a direction for the substrate web to be transported.

In a third instance, the groove is configured such that the depth thereof is stepwise changed in a direction of the width of the substrate web or/and in a direction for the substrate web to be transported.

In the film-forming apparatus of the present invention, the opening-adjusting member may be provided at the film-forming chamber in a detachable state.

In the film-forming apparatus of the present invention, the opening-adjusting member may serve as a member of forming a wall face of the film-forming chamber.

In the film-forming apparatus of the present invention, the opening-adjusting member may be arranged on a side of the film-forming face of the substrate web or a side of the opposite face of the substrate web.

A second aspect of the present invention is to provide a vacuum-processing apparatus having a processing chamber whose inside is capable of being vacuumed and in which discharging is capable of being performed, said processing chamber having an opening portion through which an object to be processed being capable of passing between an outside of said processing chamber and said inside of said processing chamber, wherein said opening portion of said processing chamber has an opening-adjusting member for narrowing an opening area of said opening portion, and a face of said opening-adjusting member which is opposed to said object which passes through said opening portion has a recessed portion.

A third aspect of the present invention is to provide a vacuum-processing method for vacuum-processing an object to be processed in a processing chamber whose inside is capable of being vacuumed and in which discharging is capable of being performed and which has an opening portion, wherein said method includes a passing step of passing said object between an outside of said processing chamber and an inside of said processing chamber, and in said passing step, said object is passed through an opening-adjusting member whose surface opposed to said object has a recessed portion.

According to the present invention in which such improved opening-adjusting member as above described is used, it is possible to effectively prevent an object to be processed such as a substrate web from being contacted with the opening-adjusting member to damage the object (or the substrate web) itself, the opening-adjusting member, or a deposited film formed on the object. In addition, the effect of the opening-adjusting member to confine processing gas such as raw material gas and electromagnetic wave within the processing chamber (the film-forming chamber) is improved. Thus, there can be attained a desirable vacuum-processing apparatus (or a desirable film-forming apparatus) which enables one to continuously produce a semiconductor element such as a photovoltaic element including a solar cell which has improved characteristics at a good yield.

Specifically, by adopting a specific opening-adjusting member 100 having a specific configuration, for instance, as shown in any of FIGS. 6 to 10, in that one or more groves are formed in a direction for the substrate web to be transported as shown in any of these figures, the object of the present can be attained as desired.

In the following, the present invention will be described in more detail with reference to the drawings.

As an example of the continuous film-forming apparatus used in the present invention, there can be mentioned a roll-to-roll type film-forming apparatus having a plurality of film-forming chambers communicated with each other. In the roll-to-roll type film-forming apparatus, a substrate web is continuously transported in the longitudinal direction to sequentially pass through the film-forming chambers while forming a desired deposited film on the substrate web by each film-forming chamber, where a semiconductor element comprising a plurality of deposited films stacked is continuously formed on the substrate web. The film formation in the film-forming apparatus may be conducted by means of plasma CVD, sputtering or the like.

As the semiconductor element, there can be mentioned, for example, a semiconductor integrated circuit, various semiconductor sensors, and various photovoltaic elements including solar cells.

The film-forming apparatus of the present invention is particularly suitable for the production of a solar cell required to have a light receiving portion having a large area.

FIG. 1 shows an example of a photovoltaic element which is produced in the present invention. The photovoltaic element shown in FIG. 1 has a layer constitution comprising a back reflecting layer 701, a transparent electrically conductive layer 702, an n-type semiconductor layer 703, an i-type semiconductor layer 704, a p-type semiconductor layer 705, and a transparent electrically conductive layer 706 stacked in this order on a substrate web 700 and has a collecting electrode 707 formed on the transparent electrically conductive layer 706.

Figure 2:
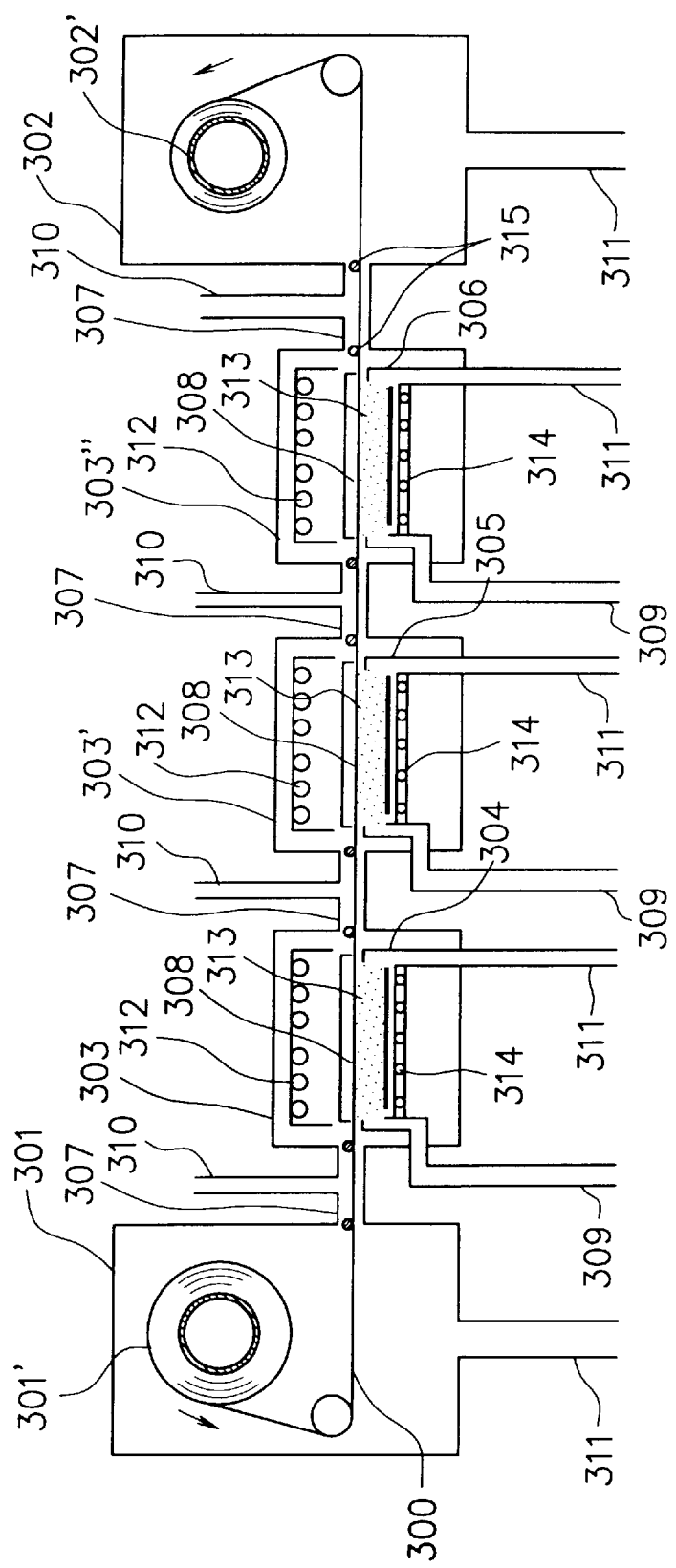
FIG. 2 is a schematic diagram illustrating the constitution of an example of a continuous film-forming apparatus having a roll-to-roll system in the present invention.

FIG. 2 is a schematic diagram illustrating the constitution of an example of the foregoing roll-to-roll type film-forming apparatus. In FIG. 2, reference numeral 300 indicates a substrate web, and reference numeral 301 a substrate delivery vacuum vessel in which a pay-out bobbin 301' having the substrate web 300 wound thereon in a coil form is installed. The substrate delivery vacuum vessel 301 is provided with an exhaust pipe 311 provided with an exhaustion regulating valve (not shown) and which is connected to a vacuum pump (not shown). Reference numeral 302 indicates a substrate take-up vacuum vessel in which a take-up bobbin 302' for taking up the substrate web 300 there on while being wound there on in a coil form is installed. The substrate take-up vacuum vessel 302 is also provided with an exhaust pipe 311 provided with an exhaustion regulating valve (not shown) and which is connected to a vacuum pump (not shown).

Reference numeral 303 indicates a first vacuum vessel in which a first-film chamber 304 having a discharge region 308 is provided, reference numeral 303' a second vacuum vessel in which a second film-forming chamber 305 having a discharge region 308 is provided, and reference numeral 303" a third vacuum vessel in which a third film-forming chamber 306 is provided.

The substrate delivery vacuum vessel 301 and the first vacuum vessel 303 are communicated with each other through a gas gate 307 through which the substrate web 300 is transported from the former vessel to the latter vessel; the first vacuum vessel 303 and the second vacuum vessel 303' are communicated with each other through a gas gate 307 through which the substrate web 300 is transported from the former vessel to the latter vessel; the second vacuum vessel 303' and the third vacuum vessel 303" are communicated with each other through a gas gate 307 through which the substrate web 300 is transported from the former vessel to the latter vessel; and the third vacuum vessel 303" and the substrate take-up vacuum vessel 302 are communicated with each other through a gas gate 307 through which the substrate web 300 is transported from the former vessel to the latter vessel.

Each gas gate 307 is provided with a separation gas introduction pipe 310.

Each the film-forming chambers 304–306 is provided with a raw material gas feed pipe 309 extending from a raw material gas supply system (not shown) and an exhaust pipe 311 provided with an exhaustion regulating valve (not shown) and which is connected to a vacuum pump (not shown).

Reference numeral 312 indicates a substrate heater for heating the substrate web 300, which is provided in each of the vacuum vessels 303–303". Reference numeral 313 indicates a high frequency power introduction electrode which is provided in each of the film-forming chambers 304–306, and reference numeral 314 an electrode heater which is provided in each of the film-forming chambers 304–306 in order to heat the high frequency power introduction electrode 313. Reference numeral 315 indicates a magnet roller.

The substrate web 300 is preferred to comprise a belt-like shaped and elongated member which has a substantially flat surface and is substantially free of distortion in a state where no external pressure is applied thereon, and which has a desired strength and has an electrically conductive surface on which a film is to be deposited. Such member as the substrate web 300 can include, for example, elongated metallic thin plates made of a metal selected from a group consisting of Al, Fe, Cu, and the like, or a metal alloy selected from a group consisting of metal alloys comprising these metals such stainless steels; and elongated composite members comprising these metallic thin films. Besides, elongated heat-resistant sheets made of polyimide, polyamide, polyethylene terephthalate, epoxy resin, or the like and which have a surface applied with electroconductive treatment by means of a metal or alloy and a transparent electrically conductive oxide (TCO) or the like in accordance with a manner using sputtering, vacuum deposition, plating or coating For the thickness of the substrate web 300, it is desired to be as thinner as possible within a range that the passage way and the form thereof established upon transporting the substrate web exhibit a desired strength. Specifically, the thickness of the substrate web 300 is desired to be preferably in a range of from 0.01 to 1 mm or more preferably in a range of from 0.05 to 0.5 mm. In the case where an elongated metallic thin plate made of a metal or the like is used, a desired strength can be readily attained even when the thickness thereof is made to be relatively thinner.

There is not a particular limitation for the width of the substrate web 300. The width of the substrate web should be determined depending upon related conditions including means for forming a deposited film employed, the size of the vacuum vessel (303, 303', 303"), and the like.

Also for the length of the substrate web 300, there is not a particular limitation. It may be a length with an extent which can be wound in a roll form. Alternatively, the substrate web may comprise a plurality of elongated members which are connected with each other by means of welding or the like to have a further elongated length.

In the film-forming apparatus shown in FIG. 2, the substrate web 300 wound on the pay-out bobbin 301' in the substrate delivery vacuum vessel 301 is paid out from the pay-out bobbin and delivered through a steering roll, followed by being transported to sequentially pass through the vacuum vessels 303, 303' and 303", and enters in the substrate take-up vacuum vessel 302 where it is taken up by and wound on the take-up bobbin 302' in a coil form, wherein by applying a desired torque to either the pay-out bobbin 301' or the take-up bobbin 302', a desired tension can be applied to the substrate web 300 in its transportation direction. On the path for the substrate web to pass, a plurality of cylindrical magnet rollers 315 are speedly arranged at a desired interval. The substrate web 300 is continuously transported while being absorbed by means of these magnet rollers 315 and while aforesaid being applied thereto, where it is possible for the substrate web to move along a desired path. The transportation speed for the substrate web 300 should be determined depending upon related film-forming conditions including thickness of a deposited film to be formed and formation speed (deposition rate) of said film. However, in general, it is preferred to be in a range of 200 to 500 mm/minute.

For the gas gate 307, separation gas such as $H_2$ gas or inert gas is introduced thereinto through the separation gas introduction pipe 310. The gas gate 307 serves to isolate the adjacent vacuum vessels one from the other by introducing such separation gas into the gas gate to prevent the gas in one vacuum vessel from being mixed with the gas in the other vacuum vessel, and it also serves to allow the substrate web 300 to pass therethrough so as to continuously transport the substrate web.

Upon transporting the substrate web 300 from the substrate delivery vacuum vessel 301 to the substrate take-up vacuum vessel 302, the substrate web 300 sequentially passes through the three film-forming chambers 304–306 while forming a desired deposited film on the substrate web by each film-forming chamber, where three kinds of deposited films are sequentially formed on the wed substrate. Thus, there is continuously formed a three-layered structure having, for instance, a p-i-n junction.

Detailed description will be made of one of the three film forming chambers in the film-forming apparatus shown in FIG. 2 with reference to FIG. 3.

Figure 3:
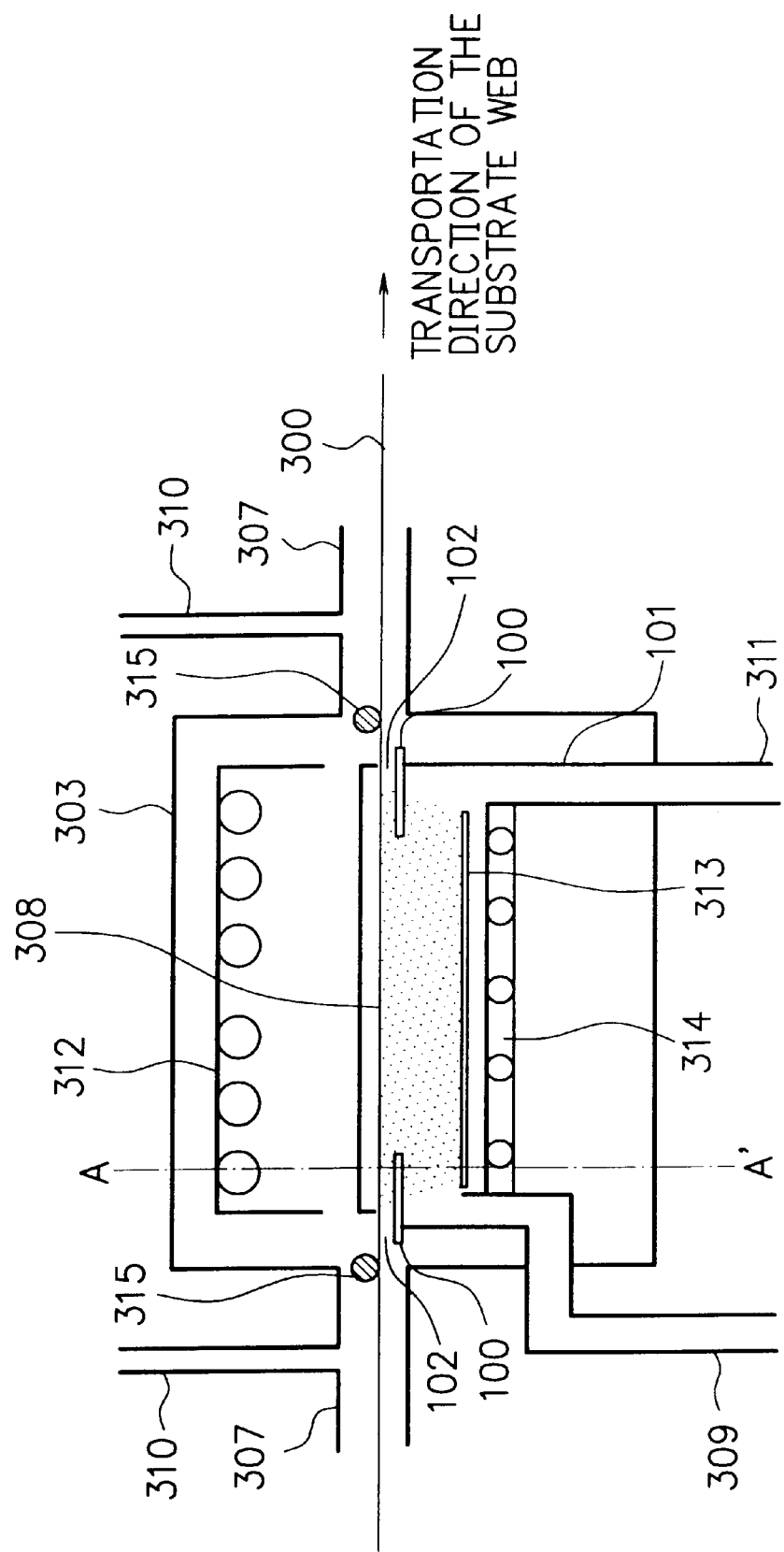
FIG. 3 is a schematic diagram illustrating the internal constitution of one of the vacuum vessels in the film-forming apparatus shown in FIG. 2.

FIG. 3 is a schematic diagram illustrating detailed structure of the first vacuum vessel 303 in FIG. 2 and its opposite side portions. In FIG. 3, reference numeral 101 indicates a film-forming chamber which is corresponding to the first film-forming chamber 304 in FIG. 2. Reference numeral 100 indicates an opening-adjusting member, and reference numeral 102 an opening portion of the film-forming chamber 101. The meanings of other reference numerals in FIG. 3 are the same as those of the corresponding reference numerals in FIG. 2.

As shown in FIG. 3, the film-forming chamber 101 has an opening portion 102 at the entrance thereof which allows the substrate web to move and enter into the film-forming chamber therethrough. The film-forming chamber 101 has another opening portion 102 at the exit thereof which allows the substrate web to move and go out outside the film-forming chamber therethrough. At each of the opposite opening portions 102 of the film-forming chamber 101, there is provided an opening-adjusting member 100.

Now, the substrate web 300 (as an object to be processed) which is transported into the vacuum vessel 303 enters into the film-forming chamber 101 (as the processing chamber) through the opening portion 102 situated at the entrance of the film-forming chamber 101, where the substrate web 300 is heated to a desired substrate temperature by means of the substrate heater 312.

The discharge region 308 in FIG. 3 comprises a region circumscribed by the circumferential wall face of the film-forming chamber 101, the high frequency power introduction electrode 313 provided in the film-forming chamber, and two opening-adjusting members 100 respectively provided at one of the opposite opening portions 102 of the film-forming chamber 101.

While introducing prescribed separation gas into each gas gate 307 through the separation gas introduction pipe 310, prescribed raw material gas from the raw material gas supply system (not shown) is introduced into the film-forming chamber 101 through the raw material gas feed pipe 309. The vacuum pump (not shown) connected to the exhaust pipe 311 is actuated to evacuate not only the inside of the film-forming chamber 101 but also that of the vacuum vessel 303 through the exhaust pipe 311. When the inner gas pressure of the film-forming chamber 101 became stable at a prescribed pressure, the high frequency power source (not shown) is switched on to apply a high frequency power of a prescribed wattage to the high frequency power introduction electrode 313, whereby the raw material gas introduced into the film-forming chamber 101 is decomposed to cause plasma discharge in the discharge region 308. By this, a desired deposited film on the substrate web 300 situated in the film-forming chamber 101 by means of plasma CVD.

In this way, a desired deposited film is formed on the substrate web 300 in each of the remaining film-forming chambers.

By using a roll-to-roll type apparatus having an apparatus constitution similar to that described in the above, it is possible to continuously a desired deposited film on the substrate web by means of sputtering.

The opening-adjusting member 100 is arranged so as to constitute a part of the film-forming chamber 101, specifically, it is arranged at the opening portion 102 provided at the film-forming chamber 101 as above described. The opening-adjusting member 100 serves to form a pathway for the substrate web to enter into or go out from the film-forming chamber. The opening-adjusting member 100 also functions to adjust the opening portion 102 so as to have a small practical magnitude with an extent in that the substrate web can pass through or to adjust the opening portion 102 so as to have a relatively large magnitude with an extent capable allowing the substrate web to pass through without its film-forming face and its rear face being contacted with the opening-adjusting member 100, whereby preventing the raw material gas and its excited species and the high frequency power from leaking outside the discharge region of the film-forming chamber, that is, into the inside area of the vacuum vessel excluding the film-forming chamber.

The opening-adjusting member 100 is shaped, for instance, macrographically in a rectangular form, and it is arranged so as to maintain a prescribed clearance to the substrate web 300 across the width direction of the substrate web (that is, a vertical direction on the paper of FIG. 3), where by adequately changing the length thereof in the transportation of the substrate web or the thickness thereof, the effect of confining the raw material gas (including its excited species) and the high frequency power within the film-forming chamber can be adjusted.

For aforesaid clearance, it is preferably in a range of from 0.1 to 10 mm or more preferably in a range of from 0.5 to 3 mm.

Besides the foregoing functions of the opening-adjusting member 100, there is also a further function in that by adjusting the length of the opening-adjusting member 100 in the transportation direction of the substrate web 300 to restrict the length of the substrate web 300 in the transportation direction thereof which is exposed to the discharge region 308, the thickness of a film deposited on the substrate web 300 which is continuously transported can be controlled.

In this embodiment, the opening-adjusting member 100 is arranged in a detachable state. However, it is possible to make a member constituting the circumferential wall face of the film-forming chamber such that it serves as the opening-adjusting member 100.

Further, in this embodiment, the opening-adjusting member 100 is arranged on the side of the film-forming face of the substrate web. But it is possible arrange on the side of the rear face of the substrate web or on each of the opposite sides of the substrate web. In this case, it is possible to prevent the opening-adjusting member 100 from contacting with the rear face side or the opposite face sides of the substrate web 300.

In this embodiment, the opening-adjusting member 100 is arranged at each of the entrance and exit of the film-forming chamber. But it is possible that the opening-adjusting member 100 is arranged only at the entrance or the exit of the film-forming chamber.

In the following, description will be made of findings for the configuration of the substrate web and its deformation which were obtained in experimental studies conducted by the present inventors in the course of accomplishing the present invention, with reference to FIGS. 2 and 3.

When the temperature of the entire substrate web 300 is constant at about room temperature, a portion of the substrate web 300 present between the magnet roller 315 situated on either side of the entrance and exit of each vacuum vessel and other magnet roller 315 situated next to the former magnet roller has a substantially flat face. Therefore, as long as the substrate web pathway of each of the film-forming chambers 304–306 and the slit-like substrate web pathway of each of the gas gates 307 have an adequate clearance, there is no occasion for the substrate web 300 to contact with the constituents of the substrate web pathways.

Incidentally, the substrate web 300 delivered from the substrate delivery vacuum vessel 301 during the film formation is transported to sequentially pass through the vacuum vessels 303–303", where the substrate web 300 is heated from the room temperature state to a desired substrate temperature by means of each substrate heater 312 and also by means of the plasma in each of the film-forming chambers 304–306. Then, during passing through each of the gas gates 307, the substrate web 300 is cooled by virtue of radiation cooling and thermal conduction, where the substrate temperature thereof is decreased, and thereafter, the substrate web is again heated to a desired substrate temperature by means of the substrate heater 312 and the plasma in each vacuum vessel in the same manner as in the above. In this way, the heightening and lowering of the temperature of the substrate web 300 are alternately repeated every time when the substrate web passes through each vacuum vessel. The fact in that the temperature of the substrate web is repeatedly changed is meant that the substrate web 300 has a temperature gradient across the entire length of the film-forming apparatus. This situation can be considered to be equivalent to that in which the substrate web has a plurality of thermally expanded portions in the width direction and a plurality of shrunk portions in width direction which are alternately connected. In addition, because a prescribed tensile strength is applied to the substrate web 300 in the transportation direction, deformation is occurred at each of the high temperature portions of the substrate web 300 in a direction perpendicular to its surface.

Figure 4:
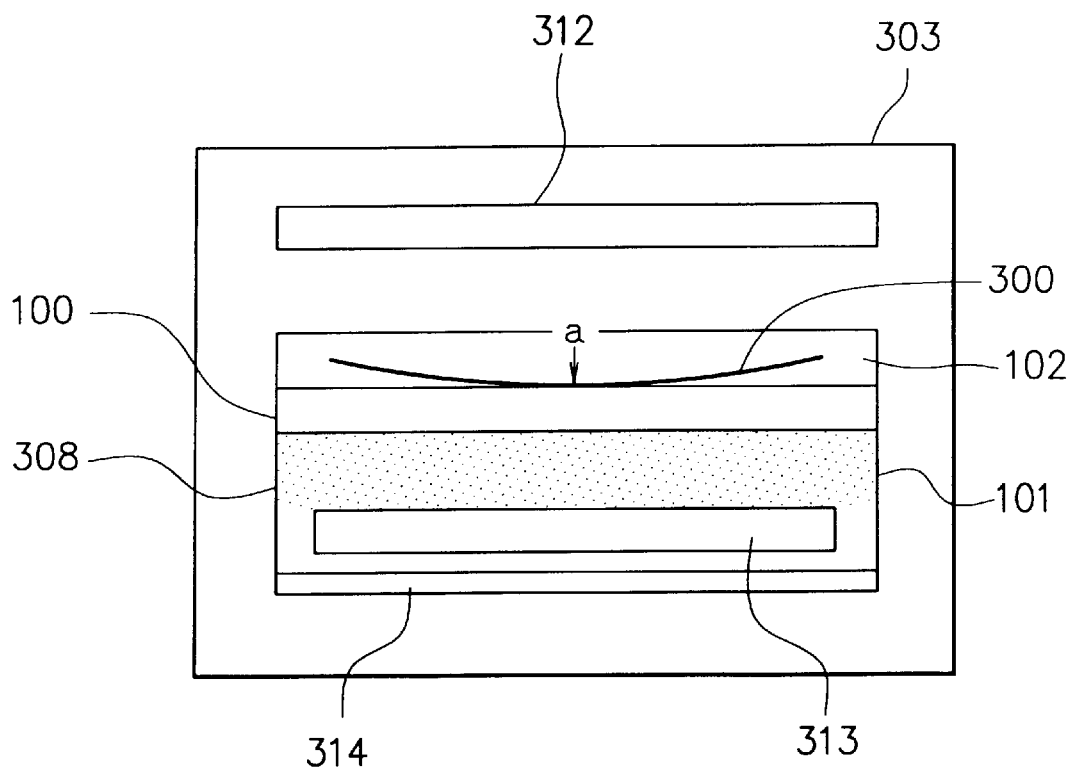
FIG. 4 is a schematic cross-sectional view taken along the line A–A' in FIG. 3, illustrating the constitution of the vacuum-processing chamber (the film-forming chamber) in the vacuum vessel shown in FIG. 3 which is provided with an opening-adjusting member as a reference example.

Separately, as a reference example, using the film-forming apparatus shown in FIG. 2 and an opening-adjusting member 100 shaped in a completely rectangular form, the present inventors tried to remedy the substrate web into a flat state by applying an external force to the substrate web 300 other than the tensile force applied to the substrate web in the transportation direction during its transportation, specifically, for instance, by increasing the magnet force of each of the magnet rollers 315, where examination was made of whether the substrate web 300 could be prevented from contacting with the opening-adjusting member 100. As a result, there were obtained such findings as will be described in the following. That is, it is sometimes difficult to remedy the substrate web 300 into a flat state depending upon some film-forming conditions relating to the degree of the film-forming temperature, the magnitude of the high frequency power, and the like, where the substrate web 300 cannot be prevented from contacting with the opening-adjusting member 100. A schematic view of a cross section along the line A–A' at a given position in FIG. 3 with respect to this case is shown in FIG. 4. FIG. 4 schematically shows a situation in that the substrate web 300 which passes through the vacuum vessel moves in a vertical direction on the paper of FIG. 4. The meanings of reference numerals in FIG. 4 are the same as those of the corresponding reference numerals in FIGS. 2 and 3.

Being different from such reference example, in the present invention, at the face of the opening-adjusting member 100 which is opposed to the substrate web, one or more grooves are formed in the direction for the substrate web to be transported. By making the opening-adjusting member 100 to have such configuration, it is possible for the opening-adjusting member 100 to be prevented from contacting with the substrate web 300.

Figure 5:
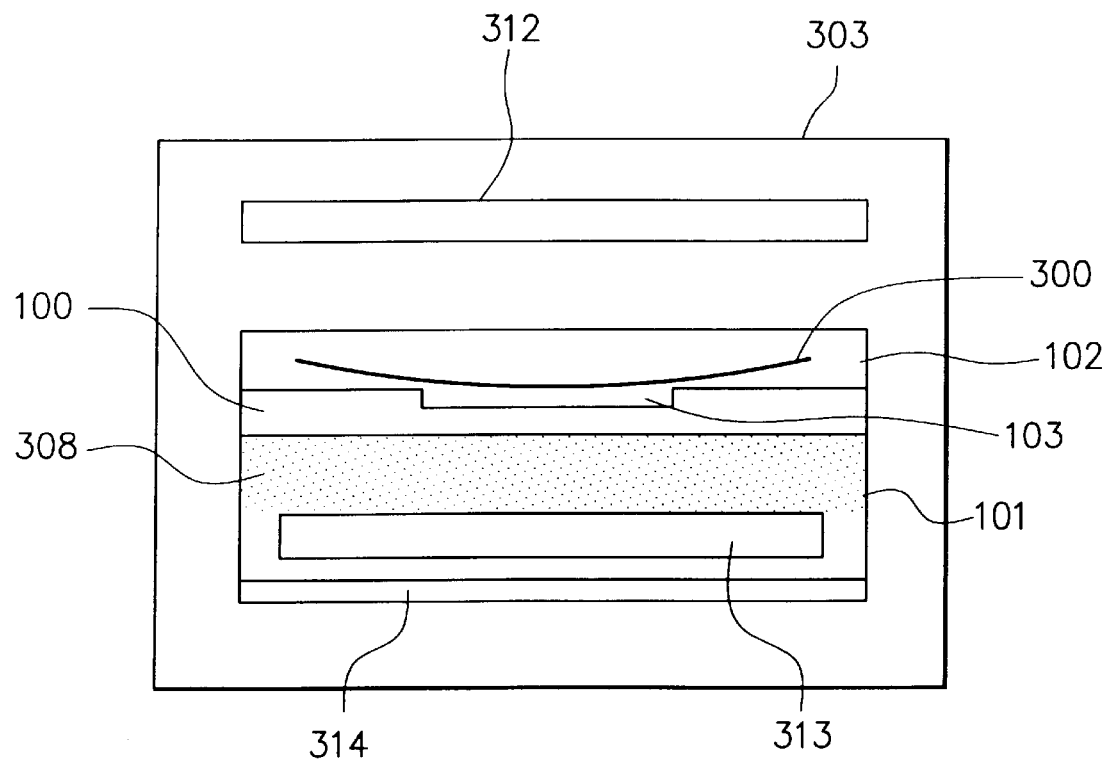
FIG. 5 is a schematic cross-sectional view taken along the line A–A' in FIG. 3, illustrating the constitution of the vacuum-processing chamber (the film-forming chamber) in the vacuum vessel shown in FIG. 3 which is provided with an opening-adjusting member in the present invention.

A schematic view of a cross section along the line A–A' in FIG. 3 for the case where the film-forming apparatus shown in FIG. 2 was operated using an example of the opening-adjusting member according to the present invention is shown in FIG. 5. FIG. 5 schematically shows a situation in that the substrate web 300 which passes through the vacuum vessel moves in a vertical direction on the paper of FIG. 5. The meanings of reference numerals in FIG. 5 are the same as those of the corresponding reference numerals in FIGS. 2 and 3.

By forming a groove 103 at a portion of the surface of the opening-adjusting member 100 which is opposed to a downward deformed convex portion of the substrate web 300 as shown in FIG. 5, it is possible to eliminate an occasion for the opening-adjusting member 100 to contact with the substrate web 300. In this case, there is not a necessity to forcibly remedy across the entire substrate web present in the apparatus.

For the groove 103 formed in the opening-adjusting member 100, its depth and its width in the width direction of the substrate web 300 may be properly determined depending the deformed extent of the substrate web 300. That is, there can be mentioned a manner of previously measuring an extent for the substrate web to be deformed and determining the depth, width and position in the width direction for the groove 103 so as to correspond the measured result.

In the apparatus shown in FIG. 5, the opening-adjusting member 100 is detached and the substrate web 300 is made to be in a state such that it does not contact with any other members than the magnet rollers, then the substrate web is heated, where a deformation quantity in an upward and downward direction and its configuration are measured using an optically measuring method and a laser displacement meter. In the case where the width of the substrate web is made to be W, when the measured deformation quantity is d at maximum and an range for the deformation quantity to become to be d/2 is W/2 in the width direction, it is necessary for the foregoing clearance to be greater than said d in the prior art. In the present invention, for instance, by making the depth of the groove 103 to be d/2, making the its width to be greater than W/2, and making the clearance of a portion excluding the groove to be d/2, it is possible to diminish the cross sectional area of the clearance portion while avoiding contact of the opening-adjusting member with the substrate web, and the foregoing confining effect of the opening-adjusting member in each of the film-forming chambers 304–306 can be desirably improved.

There can be also mentioned another method for determining the depth and the width of the groove 13 wherein a deformation quantity of the substrate web 300 is calculated in advance and a depth and a width of the groove 103 which correspond the calculated results are determined. As a specific example of this method, there can be mentioned an approximate estimation method as will be described below.

For instance, in the apparatus shown in FIG. 3, there is assumed a case where the temperature of the substrate web 300 in the gas gate 307 is t1° C. and the temperature of the substrate web 300 in the A–A' cross section is heated to t2° C. In this case, when the width of the substrate web at t1° C. is made to be W, the width W' of the substrate web at t2° C. can be approximately expressed by the following equation (1).

$$W' = W + \alpha \cdot (t2 - t1) \cdot W \tag{1}$$

where α is a linear expansion coefficient of the substrate web 300.

Next, it is assumed that in accordance with a thermally expanded extent of the substrate web 300 in the width direction thereof, displacement is occurred at the substrate web in a direction perpendicular to the surface thereof where the configuration of the substrate web is deformed into a circular arc-like convex form which is downward projected. In this case, the deformation quantity d for the surface of the substrate web 300 in the upward and downward direction can be approximately calculated by the following equation (2).

$$d = (W'^2 - W^2)^{1/2} \tag{2}$$

And, for instance, for the opening-adjusting member 100, by making the depth of the groove 103 to be d/2, making the width to be greater than W/2 but less than W, and making the clearance of the portion excluding the groove to be d/2, it is possible to diminish the cross sectional area of the clearance portion while preventing the opening-adjusting member from contacting with the substrate web, where the foregoing confining effect of the opening-adjusting member in each of the film-forming chambers 304–306 can be desirably improved. In order to obtain actual values for the above items, it is necessary to supplement the deformation quantity d with taking the rigidity of the substrate web 300 and the tensile force in the transportation direction of the substrate web into consideration.

Figure 6:
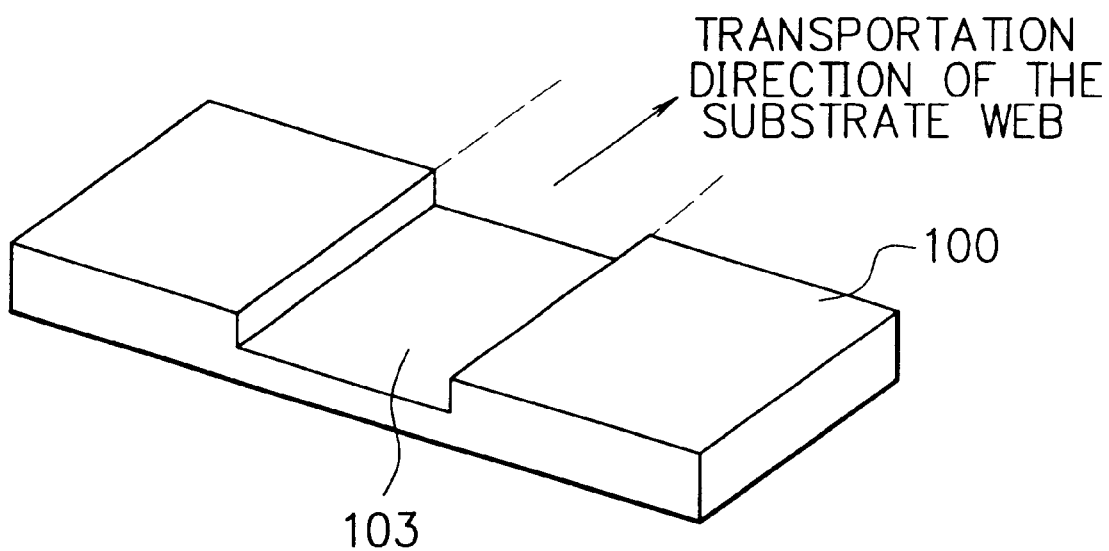
FIG. 6 is a schematic slant view illustrating the configuration of an example of an opening-adjusting member in the present invention.

FIG. 6 is a schematic slant view illustrating the configuration of the opening-adjusting member used in the above-described embodiment.

As shown in FIG. 6, the opening-adjusting member 100 has the groove 103 as a recessed portion in its opposed face which is opposed to the substrate web as an object to be processed. The groove 103 has opposite steps having a prescribed angle. The groove 103 has a groove width which is uniform along the transportation direction of the substrate web. The term "groove width" means a distance of the groove 103 in a direction one-dimensionally established within the opposed face and which is perpendicular to the transportation direction of the substrate web.

By virtue of the groove 103, the substrate web is prevented from contacting with the opening-adjusting member 100 even the substrate web is flexured or deformed.

Further, the groove 103 is provided at a given position in the opposed face. The position at which the groove 103 is provided the opposed face may be a previously estimated position of the opening-adjusting member at which the substrate web would contact with the opening-adjusting member or a position of the opening-adjusting member at which the substrate web possibly contacts with the opening-adjusting member.

As a result, it is possible to prevent the substrate web from contacting with the opening-adjusting member 100 while inhibiting the substantial opening area of the opening portion of the processing chamber (the film-forming chamber) from being enlarged.

In the vacuum-processing apparatus (the film-forming apparatus of the present invention, such recessed portion as described in the above is provided in part of the opening-adjusting member. Therefore, it is possible to prevent the substrate web (the object to be processed) from contacting with the opening-adjusting member. In addition, it is possible to prevent the raw material gas (the processing gas) including its excited species and the electromagnetic wave from being leaked outside the film-forming chamber (the processing chamber).

As above described, the film-forming apparatus of the present invention can be used as a vacuum-processing apparatus. Besides the substrate web is used as the object to be processed, it is possible to use a substantially circular member such as a semiconductor wafer, a rectangular form member whose length is relatively short such as a display plate or the like, and the like as the object to be processed.

Figure 7:
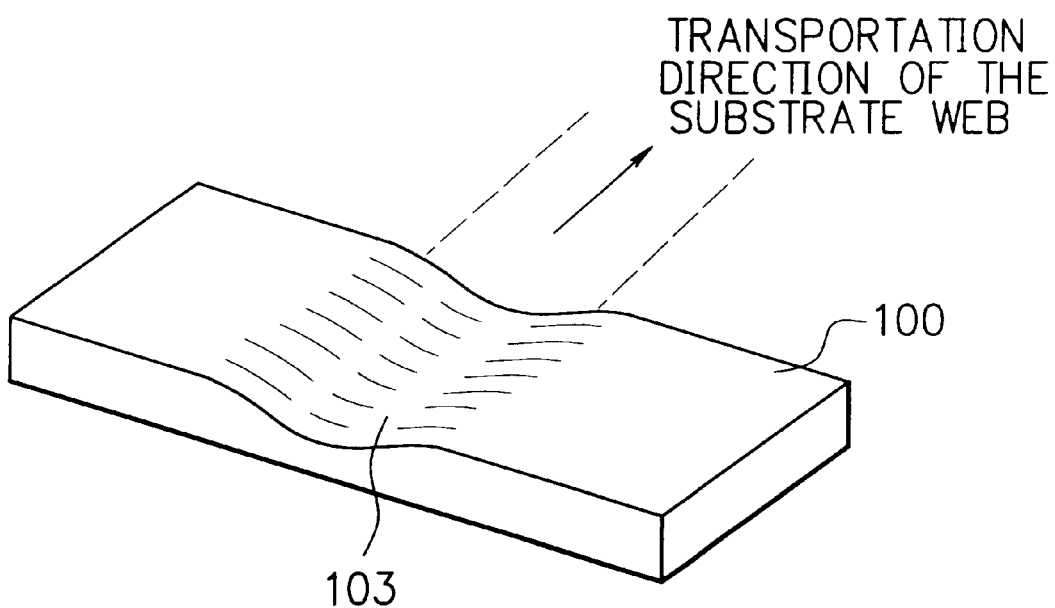
FIG. 7 is a schematic slant view illustrating the configuration of another example of an opening-adjusting member in the present invention.

The recessed portion provided in the opening-adjusting member in the film-forming apparatus as the vacuum processing apparatus of the present invention may be such configuration having steps with a prescribed angle as above described which can be formed by way of bending processing, cutting processing, or the like. Besides, the recessed portion of the opening-adjusting member may be shaped in a form having a curved configuration with a step as shown in FIG. 7.

Figure 8:
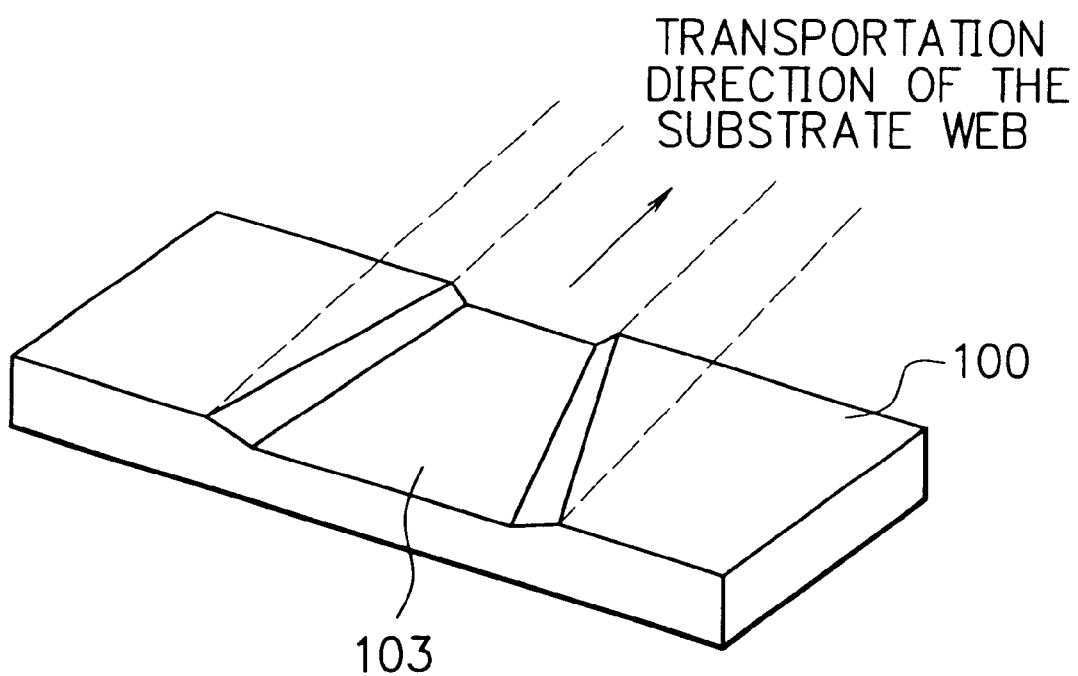
FIG. 8 is a schematic slant view illustrating the configuration of a further example of an opening-adjusting member in the present invention.
Figure 9:
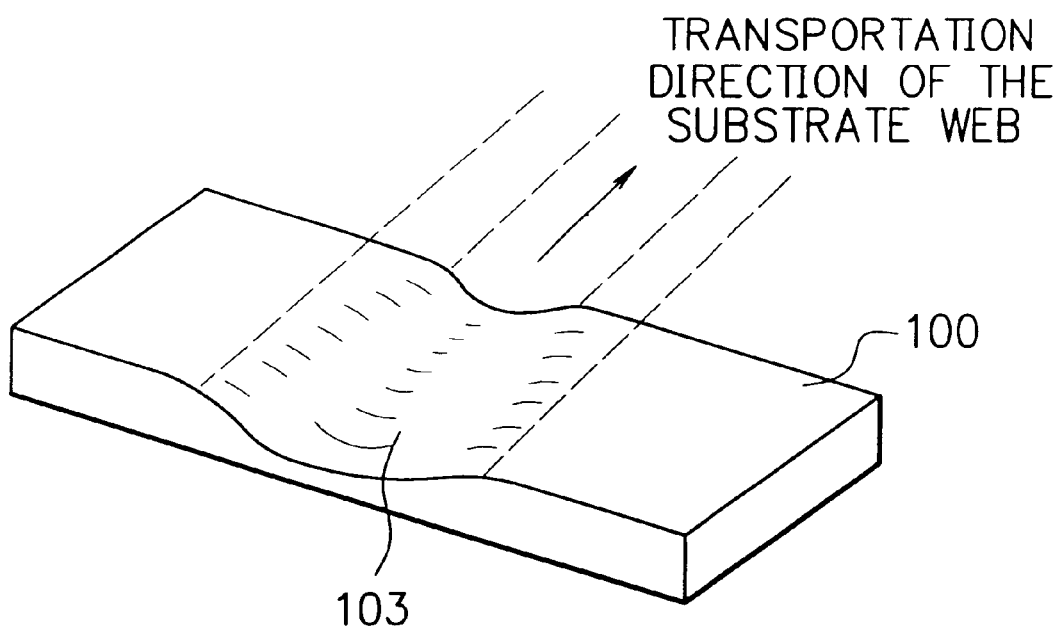
FIG. 9 is a schematic slant view illustrating the configuration of a further example of an opening-adjusting member in the present invention.

Alternatively, the recessed portion of the opening-adjusting member may be shaped in a form having a tapered configuration with steps as shown in each of FIGS. 8 and 9. The tapered configuration in each of FIGS. 8 and 9 is such that a width corresponding to the foregoing groove width is narrowed as it progresses toward the transportation direction of the substrate web. By making the recessed portion of the opening-adjusting member to have such configuration, it is also possible to prevent the substrate web (the object to be processed) from contacting with the opening-adjusting member while preventing the raw material gas (the processing gas) including its excited species and the electromagnetic wave from being leaked outside the film-forming chamber (the processing chamber).

Figure 10:
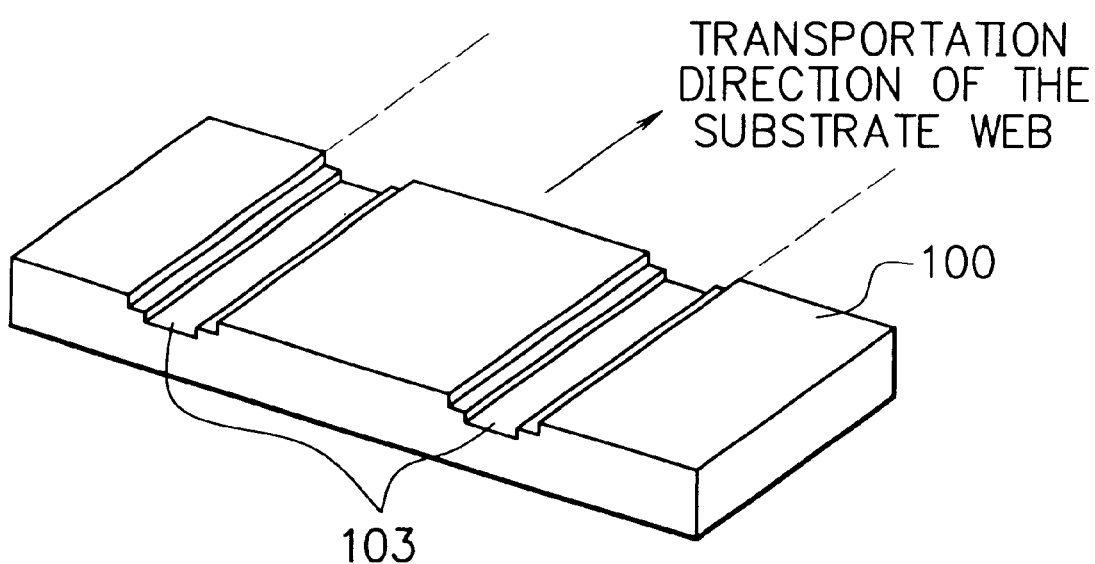
FIG. 10 is a schematic slant view illustrating the configuration of a further example of an opening-adjusting member in the present invention.

Further, the recessed portion of the opening-adjusting member may be shaped in a form having such configuration as shown in FIG. 10 in that a recessed portion comprising a plurality of grooves (two grooves in the figure) provided in the opposed face. In this case, it is a matter of course that it is possible to prevent the substrate web (the object to be processed) from contacting with the opening-adjusting member while preventing the raw material gas (the processing gas) including its excited species and the electromagnetic wave from being leaked outside the film-forming chamber (the processing chamber).

As above described, the film-forming apparatus of the present invention can be used as a vacuum-processing apparatus. The vacuum-processing apparatus can include, for example, a plasma CVD apparatus, a sputtering apparatus, an etching apparatus, an ashing apparatus, and the like.

In the following, the present invention will be described in more detail with reference to examples. It should be understood that these examples are only for illustrative purposes and are not intended to restrict the scope of the present invention.

EXAMPLE 1

In this example, using the roll-to-roll type plasma CVD apparatus having such constitution as shown in FIG. 2, there was continuously formed a p-i-n junction type photovoltaic element on an elongated substrate web as the substrate web 300 as will be described below.

Each of the film-forming chambers 304–306 in the plasma CVD apparatus used in this example is structured as shown in FIG. 3 to have an opening portion 102 at its entrance (this opening portion will be hereinafter referred to as "entrance opening portion") for the substrate web 300 to enter into the film-forming chamber and another opening portion 102 at its exit (this opening portion will be hereinafter referred to as "exit opening portion") for the substrate web 300 to go out from the film-forming chamber, where each of the film-forming chambers 304–306 has a pair of opening-adjusting members 100 having a width of 320 mm, a height 12 mm and a length of 50 mm in a direction for the substrate web 300 to be transported, one being provided at the entrance opening portion 102 and the other being provided at the exit opening portion 102.

As each of the opening-adjusting members 100 in the film-forming chamber 304, there was used an opening-adjusting member having such configuration as shown in FIGS. 5 and 6 which has a groove 103 having a depth 3 mm and a width of 120 mm formed at a central portion in the width direction, where the clearance between the remaining surface portion with no groove of the opening-adjusting member and the corresponding surface of the substrate web 300 was made to be 3 mm.

As each of the opening-adjusting members 100 in the film-forming chambers 305–306, there was used an opening-adjusting member having such configuration as shown in FIG. 4 as a reference example, which has no groove 103, the clearance of the surface of the opening-adjusting member to that of the substrate web 300 was made to be 6 mm.

Now, first, there was provided a pay-out bobbin 301' having a stainless steel substrate web (SUS430-BA) of 300 mm in width, 100 m in length and 0.2 mm in thickness as the substrate web 300 wound there on, said stainless steel substrate web having a 0.1 $\mu$m thick aluminum film as a back reflecting layer and a 1.0 $\mu$m thick ZnO film as an transparent electrically conductive layer formed in this order thereon by means of a conventional roll-to-roll type sputtering apparatus (not shown).

The pay-out bobbin 301' was set in the substrate delivery vacuum vessel 301. The substrate web 300 was paid out from the pay-out bobbin 301', and it was delivered from the substrate delivery vacuum vessel 301, followed by passing through the first gas gate 307, the vacuum vessel 303 (the film-forming chamber 304), the second gas gate 307, the vacuum vessel 303' (the film-forming chamber 305), the third gas gate 307, the vacuum vessel 303" (the film-forming chamber 306), and the fourth gas gate 307 to enter in the substrate take-up vacuum vessel 302 where the beginning portion of the substrate web 300 was fixed to and wound on the take-up bobbin 302'. And the transportation system was adjusted so that the substrate web 300 could be continuously and smoothly transported from the substrate delivery vacuum vessel 301 to the substrate take-up vacuum vessel 302 while being tensioned without being distorted or warped using a tension applying mechanism (not shown). Then, the inside of each of the vacuum vessels 301, 303, 303', 303", and 302 and the film-forming chambers 304–306 was evacuated to a vacuum of about 1 Torr by means of the respective exhaustion means each comprising the exhaust pipe 311 provided with the exhaustion regulating valve (not shown) and which is connected the vacuum pump (not shown).

While continuing the evacuation for the respective vacuum vessels and the respective film-forming chambers, He gas was flown from the respective raw material gas feed pipes 309 and also from the respective separation gas introduction pipes 310 at a flow rate of 100 sccm, and the inner pressure of each of the vacuum vessels was maintained at 1.0 Torr by regulating the opening of each of the exhaustion regulating valves (not shown) based on a reading on each of pressure gages (not shown) respectively provided in each exhaustion means. Then, each of the substrate heaters 312 was actuated to 300° C. and each of the electrode heaters 314 was also actuated to 300° C., and this operation was maintained for 5 hours, whereby the entire inside of the apparatus was subjected to baking to release impurity gas.

Then, by actuating a substrate-conveying mechanism (not shown) provided at the take-up bobbin 302', the substrate web 300 was started transporting at a transportation speed of 1000 mm/minute. Then, the substrate web 300 moving in each of the vacuum vessels 303–303" was heated to have a prescribed substrate temperature using the corresponding substrate heater 312 and a corresponding substrate temperature monitor (not shown). When the substrate web 300 became so that it was uniformly heated to have a prescribed substrate temperature in each of the film-forming chambers 304–306, while continuing the heating of the substrate web 300, the introduction of the He gas through the respective raw material gas feed pipes 309 was terminated, followed by introducing prescribed raw material gases into the each of the film-forming chambers 304–306 at prescribed respective flow rates through the corresponding raw material gas feed pipe 309. In this case, $H_2$ gas as the separation gas was flown into each of the gas gates 307 at a flow rate of 1000 sccm through the corresponding gate gas introduction pipe 310. Then, in each of the film-forming chambers 304–306, an RF power of a prescribed wattage was supplied through the high frequency power introduction electrode 313 to case plasma discharge in the discharge region 308 to decompose the raw material gases therein, whereby on the substrate web 300 which was moving, there were sequentially formed an n-type amorphous silicon semiconductor film as an n-type semiconductor layer by the film-forming chamber 304, an i-type amorphous silicon semiconductor film as an i-type semiconductor layer by the film-forming chamber 305, and a p-type microcrystalline silicon semiconductor film as a p-type semiconductor layer by the film-forming chamber 305. In this way, a semiconductor layer having a three-layered structure with a n-i-p junction for a photovoltaic element was continuously formed on the substrate web 300.

Details of the film-forming conditions in the respective film-forming chambers 304–306 in the above are collectively shown in Table 1.

The above film-forming operation was continuously conducted for about 5 hours, whereby the semiconductor layer having a three-layered structure with a n-i-p junction was formed over the length of 70 m of the substrate web 300 having a length of 100 m.

Thereafter, the supply of the discharging power and the introduction of the raw material gases in each of the film-forming chambers 304–306 were terminated, the heaters in the respective vacuum vessels were switched off, and the inside of each of the vacuum vessels was sufficiently purged. Then, the substrate web and the inside of the apparatus were sufficiently cooled. Thereafter, the inside of the apparatus was returned to atmospheric pressure, and the take-up bobbin 302' having the substrate web with the three-layered semiconductor layer wound thereon in a coil form (this will be hereinafter referred to as "substrate web roll") was taken out from the substrate take-up vacuum vessel 302.

The substrate web roll thus taken out was set in a conventional roll-to-roll type film-forming apparatus by way of sputtering (not shown), where a 80 nm thick ITO film as a transparent electrically conductive layer (that is, a transparent electrode layer) was continuously formed on the three-layered semiconductor layer formed on the substrate web 300. While delivering the substrate web 300 from the resultant roll, the substrate web 300 was cut at every 100 mm interval in the transportation direction by means of a cutting machine (not shown) to obtain 700 rectangular elements each having a width of 300 mm and a length of 100mm. Then, on the transparent electrode layer of each of the resultant elements, there was formed a collecting electrode by screen-printing an Ag-paste. By this, there were obtained 700 rectangular photovoltaic elements each having such configuration as shown in FIG. 1.

For each of the resultant photovoltaic elements, evaluation was conducted with respect to its I–V characteristics under irradiation of pseudo sunlight of AM 1.5 having an energy density of 100mW/cm$^2$. And based on the I–V characteristics, a photoelectric conversion efficiency ($\eta$) was obtained for each of the photovoltaic elements. And there was calculated an average value as an average photoelectric conversion efficiency among the photoelectric conversion efficiencies of the photovoltaic elements involved. The evaluated result obtained is shown in Table 2.

Separately, from each of 70 groups each comprising 10 photovoltaic voltaic elements obtained from every 1 m length of the substrate web 300 in the transportation direction, one photovoltaic element sample was randomly selected to obtain 70 photovoltaic element samples.

For each of the resultant 70 photovoltaic element samples, its photoelectric conversion efficiency was evaluated in the same manner as in the above. And for the evaluated photoelectric conversion efficiencies, there were obtained an average value, a maximum value and a minimum value. And a difference between the maximum value and the minimum value was obtained. The proportion of the resultant difference versus the average value was obtained. The resultant proportion is shown in Table 2 as an uniformity in terms of the photovoltaic element characteristics.

In addition, for all the 700 photovoltaic elements, the proportion of having no occurrence of short circuit, i.e., shunt was evaluated as a qualitative product rate. The evaluated result is shown in Table 2.

In this example, during the film-formation, particularly in the film-forming chamber 304, the desired film-forming conditions could be maintained and accomplished while desirably preventing the raw material gases and their excited species and the high frequency power from leaking outside the film-forming chamber 304 and substantially no contact was occurred between the opening-adjusting members and the substrate web, where the opening-adjusting members and the substrate web were not damaged. In this connection, the resultant photovoltaic elements were satisfactory in terms of the photoelectric conversion efficiency and uniformity and were excellent in terms of the qualitative product rate as shown in Table 2.

Comparative Example 1

The procedures of Example 1 were repeated, except that each of the two opening-adjusting members 100 in the film-forming chamber 304 was replaced by an opening-adjusting member having such configuration shown in FIG. 4 with no groove and the clearance between each opening-adjusting member and the substrate web 300 was made to be 6 mm, to obtain 700 photovoltaic elements.

For the resultant photovoltaic elements, evaluation was conducted in the same manner as in Example 1.

The evaluated results obtained are collectively shown in Table 2.

In this comparative, during the film formation, leakage of the plasma from the opening portion 102 was occurred in each of the film-forming chamber 304 and the film-forming chamber 305, where in each of the vacuum vessels 303 and 303', film deposition was occurred on the inner wall face. Further, in the film-forming chamber 304, the substrate web 300 was partially contacted with each opening-adjusting member, where flaws were occurred at the substrate web. Because of this, the evaluated results of this comparative example are inferior to those of Example 1 as apparent from Table 2.

EXAMPLE 2

In Example 1, there was observed an occasion in the film-forming chamber 305 in Example 1 such that the substrate web 300 would be deformed as to form two downward projected portions at different positions of the substrate web in the transportation direction.

In this respect, in this example, each of the two opening-adjusting members in the film-forming chamber 305 in Example 1 was replaced by an opening-adjusting member having such configuration as shown in FIG. 10 in which two grooves 103 each having a binary steps-bearing groove structure comprising a first step groove having a depth of 1.5 mm and a width of 5 mm and a second step groove having a depth of 3 mm and a width of 15 mm are spacedly formed in the depthwise direction at different positions in the transportation direction of the substrate web, where the clearance between the remaining surface portion with no groove of the opening-adjusting member and the corresponding surface of the substrate web was made to be 3 mm.

Except for the above point, the procedures of Example 1 were repeated to obtain 700 photovoltaic elements.

For the resultant photovoltaic elements, evaluation was conducted in the same manner as in Example 1.

The evaluated results obtained are collectively shown in Table 2.

In this example, the film formation in the film-forming chamber 305 could be more efficiently carried out in comparison with that in Example 1. Particularly, in this example, the film formation in the film-forming chamber 305 could be more efficiently carried out while more effectively preventing the raw material gases and their excited species and the high frequency power from leaking outside the film-forming chamber 305, where the raw material gases and their excited species and the high frequency power could be effectively confined within the film-forming chamber 305 and the desired high frequency power could be effectively applied to the raw material gases introduced into the film-forming chamber 305.

Hence, the evaluated photoelectric conversion efficiency and uniformity in this example are superior to those in Example 1 as apparent from Table 2.

EXAMPLE 3

In Example 2, there was observed an occasion in the film-forming chamber 306 in Example 2 such that the substrate web 300 would be deformed as to form a downward projected portion at one position of the substrate web in the transportation direction and the deformation quantity of the substrate web would be varied in the transportation direction of the substrate web.

In this respect, in this example, each of the two opening-adjusting members in the film-forming chamber 306 in Example 2 was replaced by an opening-adjusting member having such configuration as shown in FIG. 8 in which a groove 103 having a tapered groove form with a groove width continuously changed toward the transportation direction of the substrate web and a groove depth continuously changed also toward the transportation direction of the substrate web and which has an upstream end portion with a width of 60 mm and a depth of 3 mm with respect to the transportation direction of the substrate web and a downstream end portion with a width of 20 mm and a depth of 1 mm with respect to the transportation direction of the substrate web, where the clearance between the remaining surface portion with no groove of the opening-adjusting member and the corresponding surface of the substrate web was made to be 3 mm.

Except for the above point, the procedures of Example 2 were repeated to obtain 700 photovoltaic elements.

For the resultant photovoltaic elements, evaluation was conducted in the same manner as in Example 1.

The evaluated results obtained are collectively shown in Table 2.

In this example, the film formation in the film-forming chamber 306 could be more efficiently carried out in comparison with that in Example 2. Particularly, in this example, the film formation in the film-forming chamber 306 could be more efficiently carried out while more effectively preventing the raw material gases and their excited species and the high frequency power from leaking outside the film-forming chamber 306, where the raw material gases and their excited species and the high frequency power could be effectively confined within the film-forming chamber 306 and the desired high frequency power could be effectively applied to the raw material gases introduced into the film-forming chamber 306.

Hence, the evaluated photoelectric conversion efficiency and uniformity in this example are superior to those in Example 2 as apparent from Table 2.

As apparent from the above description, according to the present invention, it is possible to effectively prevent a substrate web as an object to be vacuum-processed from being contacted with the constituents of a vacuum-processing apparatus including a film-forming apparatus used during the vacuum processing (or the film formation). Because of this, there can be attained a desirable vacuum-processing apparatus (or a desirable film-forming apparatus) having a high productivity and which enables one to continuously and efficiently form a high quality deposited film having an improved film property at a high qualitative product rate while effectively preventing a film deposited from being damaged. Further, according to the present invention, it is possible to prevent a raw material gas including excited species said raw material gas, an electric power, and a plasma in a film-forming chamber as a vacuum-processing chamber from leaking outside the film-forming chamber upon performing film formation (or vacuum-processing) therein, where desired film-forming conditions (or desired vacuum-processing conditions) can be realized. This situation enables one to continuously and effectively form a high quality deposited film which excels in characteristics and uniformity.

TABLE 1

| film-forming chamber | name of layer formed: thickness (nm) | name of gas used & its flow rate (sccm) | inner pressure (Torr) | effective electric power (W) | substrate temperature (° C.) | film-forming speed (nm/sec) |
|---|---|---|---|---|---|---|
| 304 | n-type layer (20 nm) | SiH$_4$: 100<br>H$_2$: 1000<br>PH$_3$/H$_2$(2%): 150 | 1.0 | RF power (200 W) | 270 | 1.2 |
| 305 | i-type layer (90 nm) | SiH$_4$: 100<br>H$_2$: 500 | 1.0 | RF power (800 W) | 350 | 3.0 |
| 306 | p-type layer (8 nm) | SiH$_4$: 20<br>H$_2$: 3000<br>BF$_3$/H$_2$(2%): 30 | 1.0 | RF power (1000 W) | 300 | 0.2 |

TABLE 2

| | photoelectric conversion efficiency (η) | uniformity | qualitative product rate |
|---|---|---|---|
| Comparative Example 1 | 4.5% | ±6% | 60% |
| Example 1 | 4.9% | ±4% | 100% |
| Example 2 | 5.1% | ±3% | 100% |
| Example 3 | 5.4% | ±2% | 100% |

What is claimed is:

1. A film-forming apparatus which has at least a vacuum vessel whose inside is capable of being vacuumed and a film-forming chamber having a discharge region provided in said vacuum vessel and in which a substrate web having a desired width and a desired length is arranged so as to constitute a part of said film-forming chamber, wherein said substrate web is continuously moved to pass through said discharge region of said film-forming chamber to continuously form a deposited film on said substrate web, characterized in that said film-forming chamber is provided with an opening-adjusting member such that said opening-adjusting member constitutes an entrance or/and an exit of said film-forming chamber, and a face of said opening-adjusting member which is opposed to said substrate web has one or more grooves formed substantially in parallel to a direction for said substrate web to be transported.

2. A film-forming apparatus according to claim 1, wherein said groove of said opening-adjusting member is configured such that a width of said groove in a direction of the width of the substrate web is continuously changed in a direction for the substrate web to be transported.

3. A film-forming apparatus according to claim 1, wherein said groove of said opening-adjusting member is configured such that a depth of said groove is continuously changed in a direction of the width of the substrate web or/and in a direction for the substrate web to be transported.

4. A film-forming apparatus according to claim 1, wherein said groove of said opening-adjusting member is configured such that a depth of said groove is stepwise changed in a direction of the width of the substrate web or/and in a direction for the substrate web to be transported.

5. A film-forming apparatus according to claim 1, wherein said opening-adjusting member is provided at the film-forming chamber in a detachable state.

6. A film-forming apparatus according to claim 1, wherein said opening-adjusting member is provided such that it serves as a member of forming a wall face of the film-forming chamber.

7. A film-forming apparatus according to claim 1, wherein said opening-adjusting member is arranged on a side of a film-forming face of the substrate web or a side of the opposite face of the substrate web.

8. A vacuum-processing apparatus having a processing chamber whose inside is capable of being vacuumed and in which discharging is capable of being performed, said processing chamber having an opening portion through which an object to be processed being capable of passing between an outside of said processing chamber and said inside of said processing chamber, wherein said opening portion of said processing chamber has an opening-adjusting member for narrowing an opening area of said opening portion, and an opposite face of said opening-adjusting member which is opposed to said object which passes through said opening portion has a recessed portion.

9. A vacuum-processing apparatus according to claim 8, wherein said object is a substrate web.

10. A vacuum-processing apparatus according to claim 8, wherein said processing chamber is a film-forming chamber.

11. A vacuum-processing apparatus according to claim 8 has a vessel whose inside being capable of being vacuumed which is provided to enclose said processing chamber.

12. A vacuum-processing apparatus according to claim 8 which has a passing means for making said object comprising a substrate web to pass through said opening portion of said processing chamber.

13. A vacuum-processing apparatus according to claim 8, wherein said processing chamber is for forming a deposited film on said object therein.

14. A vacuum-processing apparatus according to claim 8, wherein said opening portion is at least a carrying-in opening for carrying said object in said processing chamber or a carrying-out opening for carrying said object out from said object.

15. A vacuum-processing apparatus according to claim 8, wherein said recessed portion comprises one or more grooves.

16. A vacuum-processing apparatus according to claim 8, wherein said recessed portion comprises one or more grooves which are arranged substantially in parallel to a direction for said object to pass through said opening portion.

17. A vacuum-processing apparatus according to claim 8, wherein said recessed portion has a width perpendicular to a passing direction for said object to pass through said opening portion and said width is continuously changed with respect to said passing direction.

18. A vacuum-processing apparatus according to claim 8, wherein said recessed portion has a depth which is continuously changed in a passing direction for said object to pass through said opening portion or/and in a direction perpendicular to said passing direction.

19. A vacuum-processing apparatus according to claim 8, wherein said opening-adjusting member is provided at said processing chamber in a detachable state.

20. A vacuum-processing apparatus according to claim 8, wherein said opening-adjusting member is provided such that it serves as a member of forming a wall face of said processing chamber.

21. A vacuum-processing apparatus according to claim 8, wherein said opening-adjusting member is arranged on a side of a processing face of said object or a side of the opposite face of said object.

22. A vacuum-processing apparatus according to claim 8, wherein said discharging is plasma discharging.

23. A vacuum-processing apparatus according to claim 8, wherein said vacuum-processing apparatus is a plasma CVD apparatus.

24. A vacuum-processing apparatus according to claim 8, wherein said vacuum-processing apparatus is a film-forming apparatus for forming a deposited film on said object.

25. A vacuum-processing apparatus according to claim 8, wherein said recessed portion has a step rugged against said opposite face which is plane.

26. A vacuum-processing apparatus according to claim 8, wherein said recessed portion has a step curved against said opposite face which is plane.

27. A vacuum-processing method for vacuum-processing an object to be processed in a processing chamber whose inside is capable of being vacuumed and in which discharging is capable of being performed and which has an opening portion, wherein said method includes a passing step of passing said object between an outside of said processing chamber and an inside of said processing chamber, and in said passing step, said object is passed through an opening-adjusting member whose surface opposed to said object has a recessed portion.

* * * * *

UNITED STATES PATENT AND TRADEMARK OFFICE
CERTIFICATE OF CORRECTION

PATENT NO. : 6,447,612 B1
DATED : September 10, 2002
INVENTOR(S) : Koichiro Moriyama et al.

It is certified that error appears in the above-identified patent and that said Letters Patent is hereby corrected as shown below:

Column 1,
Line 37, "to" should read -- to as --.

Column 2,:
Line 53, "have" should read -- to have --;
Line 54, "smaller" should read -- small --;
Line 57, "use" should read -- to use --; and
Line 66, "a" should read -- an --.

Column 3,
Line 2, "have" should read -- has --;
Line 7, "flexture." should read -- flexure. --;
Line 8, "flexture" should read -- flexure --;
Line 17, "corresponds" should read -- corresponds to --; and
Line 44, "to" should read -- to as --.

Column 4,
Line 22, "smaller" should read -- small --;
Line 40, "shorten" should read -- shorter --; and
Line 42, "to close" should read -- too close to --.

Column 5,
Line 2, "An" should read -- A --; and
Line 56, "per formed" should read -- performed --.

Column 7,
Line 54, "groves" should read -- grooves --; and
Line 57, "present" should read -- present invention --.

Column 8,
Line 34, "there on" should read -- thereon --;
Line 35, "there on" should read -- thereon --; and
Line 41, "first-film" should read -- first film-forming --.

UNITED STATES PATENT AND TRADEMARK OFFICE
CERTIFICATE OF CORRECTION

PATENT NO. : 6,447,612 B1
DATED : September 10, 2002
INVENTOR(S) : Koichiro Moriyama et al.

It is certified that error appears in the above-identified patent and that said Letters Patent is hereby corrected as shown below:

Column 9,
Line 24, "such" should read -- such as --;
Line 34, "thinner" should read -- thin --; and
Line 67, "specedly" should read -- spacedly --.

Column 10,
Line 26, "wed" should read -- web --.

Column 11,
Line 15, "deposited film" should read -- film is deposited --; and
Line 22, "a desired deposited" should read -- deposit a desired --.

Column 13,
Line 52, "depending" should read -- depending upon --; and
Line 56, "correspond" should read -- correspond to --.

Column 14,
Line 1, "an" should read -- a --;
Line 5, "the its" should read -- its --;
Line 8, "cross sectional" should read -- cross-sectional --;
Line 14, "groove 13" should read -- groove 103 --;
Line 17, "correspond." should read -- correspond to --; and
Line 49, "cross sectional" should read -- cross-sectional --.

Column 15,
Line 7, "even" should read -- even when --; and
Line 22, "invention," should read -- invention), --.

Column 16,
Line 57, "there on," should read -- thereon, --; and
Line 59, "an" should read -- a --.

Column 17,
Line 18, "connected" should read -- connected to --; and
Line 55, "case" should read -- cause --.

UNITED STATES PATENT AND TRADEMARK OFFICE
CERTIFICATE OF CORRECTION

PATENT NO. : 6,447,612 B1
DATED : September 10, 2002
INVENTOR(S) : Koichiro Moriyama et al.

It is certified that error appears in the above-identified patent and that said Letters Patent is hereby corrected as shown below:

Column 18,
Line 47, "voltaic" should be deleted; and
Line 59, "an" should read -- a --.

Column 21,
Line 10, "species" should read -- a species of --.

Column 22,
Line 65, "in" should read -- into --; and
Line 67, "object." should read -- processing chamber. --.

Column 23,
Line 24, "of forming" should read -- for forming --.

Signed and Sealed this

Twenty-fifth Day of February, 2003

JAMES E. ROGAN
*Director of the United States Patent and Trademark Office*